United States Patent
Bedell et al.

(10) Patent No.: US 9,079,269 B2
(45) Date of Patent: Jul. 14, 2015

(54) SPALLING WITH LASER-DEFINED SPALL EDGE REGIONS

(75) Inventors: Stephen W. Bedell, Wappingers Falls, NY (US); Cheng-Wei Cheng, White Plains, NY (US); Keith E. Fogel, Hopewell Junction, NY (US); Devendra K. Sadana, Pleasantville, NY (US); Katherine L. Saenger, Ossining, NY (US); Norma E. Sosa Cortes, New York, NY (US); Ning Li, White Plains, NY (US); Ibrahim Alhomoudi, Alhufof (SA)

(73) Assignee: International Business Machines Corporation, Armonk, NY (US)

( * ) Notice: Subject to any disclaimer, the term of this patent is extended or adjusted under 35 U.S.C. 154(b) by 904 days.

(21) Appl. No.: 13/302,427

(22) Filed: Nov. 22, 2011

(65) Prior Publication Data

US 2013/0126493 A1    May 23, 2013

(51) Int. Cl.
  *B23K 26/00* (2014.01)
  *H01L 21/304* (2006.01)
  *B23K 26/06* (2014.01)
  *B23K 26/36* (2014.01)
  *B23K 26/40* (2014.01)

(52) U.S. Cl.
  CPC .......... *B23K 26/0635* (2013.01); *B23K 26/367* (2013.01); *B23K 26/4075* (2013.01)

(58) Field of Classification Search
  USPC ............................. 219/121.85; 438/690, 759
  See application file for complete search history.

(56) References Cited

U.S. PATENT DOCUMENTS

| | | | |
|---|---|---|---|
| 4,448,636 A | 5/1984 | Baber | |
| 4,988,412 A | 1/1991 | Liu et al. | |
| 5,674,328 A | 10/1997 | Mannava et al. | |
| 2006/0118513 A1* | 6/2006 | Faure et al. | 216/33 |
| 2007/0262464 A1* | 11/2007 | Watkins et al. | 257/774 |
| 2010/0311250 A1 | 12/2010 | Bedell et al. | |
| 2012/0318334 A1* | 12/2012 | Bedell et al. | 136/255 |

OTHER PUBLICATIONS

Clauer, A. H., "Laser Shock Peening for Fatigue Resistance", Surface Performance of Titanium,1996,pp. 217-230, Warrendale, PA, US, Abstract only.
Tamura, H., et al., "Femtosecond-laser-induced spallation in aluminum", J. Appl. Phys., Mar. 15, 2001, vol. 89, No. 6.
(Continued)

*Primary Examiner* — Mamadou Diallo
(74) *Attorney, Agent, or Firm* — Scully, Scott, Murphy & Presser, P.C.; Louis J. Percello, Esq.

(57) ABSTRACT

Laser ablation can be used to form a trench within at least a blanket layer of a stressor layer that is atop a base substrate. A non-ablated portion of the stressor layer has an edge that defines the edge of the material layer region to be spalled. Laser ablation can also be used to form a trench within a blanket material stack including at least a plating seed layer. A stressor layer is formed on the non-ablated portions of the material stack and one portion of the stressor layer has an edge that defines the edge of the material layer region to be spalled. Laser ablation can be further used to form a trench that extends through a blanket stressor layer and into the base substrate itself. The trench has an edge that defines the edge of the material layer region to be spalled.

11 Claims, 9 Drawing Sheets

(56) References Cited

OTHER PUBLICATIONS

Li, X-Z., et al., "Microcracks, spall and fracture in glass: A study using short pulsed laser shock waves", Journal of Applied Physics, Apr. 1, 1998, vol. 83, No. 7.

Eliezer, S., et al., "Laser-induced spall in metals: Experiment and simulation", Journal of Applied Physics, Jan. 15, 1990, vol. 67, No. 2.

Steverding, B. et al., "Laser-induced shocks and their capability to produce fracture", Journal of Applied Physics, May 5, 1976, vol. 47, No. 5.

Wong, W.S. et al., "Fabrication of thin-film InGaN light-emitting diode membranes by laser lift-off", Applied Physics Letters, Sep. 6, 1999, vol. 75, No. 10.

* cited by examiner

SPALLING WITH LASER-DEFINED SPALL EDGE REGIONS

BACKGROUND

The present disclosure relates to semiconductor device manufacturing, and more particularly, to methods for spalling, i.e., removing, a material layer region of a base substrate, wherein laser ablation is used to define an edge of the material layer region that is to be spalled.

Devices that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if the substrate from which a device layer is removed can be reused, additional fabrication cost reduction can be achieved.

Recent advances in spalling techniques now make it possible to remove, i.e., spall, a thin (typically less than 100 µm) semiconductor layer from an entire surface of base semiconductor substrate with near-zero thickness direction kerf losses, and to do this multiple times on the same base semiconductor substrate. The potential cost savings are enormous since (i) the thickness of the spalled semiconductor layer can be limited to the thickness needed for thin-film devices and (ii) many semiconductor layers may be derived from a single base substrate.

U.S. Patent Application Publication No. 2010/0311250 to Bedell et al. discloses a spalling process that can be employed in removing a thin semiconductor device layer from a base semiconductor substrate. The spalling method disclosed in the aforementioned publication includes depositing a stressor layer (i.e., a spall-inducing layer) on a base semiconductor substrate, placing an optional handle substrate on the stressor layer, and inducing a crack and its propagation below the substrate/stressor interface. This process, which is performed at room temperature, removes a thin layer of the base semiconductor substrate below the stressor layer. As some stages after spalling, some or all of the stressor layer can be removed utilizing an etch process.

Further improvements of spalling are needed which render spalling more efficient, controllable, and economical and thus more reliable for use in forming thin film devices.

SUMMARY

Laser ablation is used for defining an edge of a material layer region (or portion) that is to be removed from a spalling structure comprising at least a base substrate and a stressor layer. In one embodiment, laser ablation is used to form a trench within at least a blanket layer of a stressor layer that is located atop a base substrate. A non-ablated portion of the stressor layer has an edge that defines the edge of the material layer region to be spalled. In another embodiment, laser ablation is used to form a trench within a blanket material stack including at least a plating seed layer. A stressor layer is formed on the non-ablated portions of the material stack and one portion of the stressor layer has an edge that defines the edge of the material layer region to be spalled. In another embodiment, laser ablation is used to form a trench that extends through a blanket stressor layer and into the base substrate itself. The trench has an edge that defines the edge of the material layer region to be spalled.

In one embodiment of the present disclosure, a method of spalling, i.e., removing, a material layer region (or portion) of a base substrate is provided. The method includes forming at least a stressor layer atop an uppermost surface of a base substrate. A trench is formed by laser ablation at least within the stressor layer to define an edge of a material layer region to be spalled. The material layer region of the base substrate is then spalled.

In another embodiment of the present disclosure, another method of spalling, i.e., removing, a material layer region (or portion) of a base substrate is provided. In this embodiment, the method includes forming a material stack comprising at least a plating seed layer atop an uppermost surface of a base substrate. A trench is formed by laser ablation at least within the material stack to define an edge of a material layer region to be spalled. A stressor layer portion is then formed on a non-ablated portion of the material stack. Next, the material layer region of the base substrate is spalled.

In a further embodiment of the present disclosure, a further method of spalling, i.e., removing, a material layer region (or portion) of a base substrate is provided. In this embodiment, the method includes forming at least a stressor layer atop an uppermost surface of a base substrate. A trench is formed by laser ablation within a vertical sidewall portion of the base substrate. The trench defines an edge of a material layer region of the base substrate to be spalled. The material layer region of the base substrate is then spalled.

BRIEF DESCRIPTION OF THE DRAWINGS

FIG. 3A-3E are pictorial representations (through cross sectional views) illustrating the structure of FIG. 2 after forming a trench by laser ablation; in FIG. 3A, the trench stops on an uppermost surface of the base substrate, in FIG. 3B, the trench extends in the base substrate to a depth that is less than the fracture plane, in FIG. 3C, the trench extends in the base substrate to a depth that is equal to the fracture plane, in FIG. 3D, the trench extends in the base substrate to a depth that is greater than the fracture plane depth, and, in FIG. 3E, the trench extends in the base substrate and has an expanded width opening.

FIGS. 8A-8B are pictorial representations (through cross sectional views) illustrating the structure of FIG. 7 after forming a stressor layer; in FIG. 8A the stressor layer is formed by selective plating, while in FIG. 8B the stressor layer is formed by non-selective plating.

DETAILED DESCRIPTION

The present disclosure, which relates to methods of spalling a material layer region (or portion) from a base substrate using laser ablation to define an edge of the material layer region to be spalled, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

It will be understood that when an element as a layer, region, or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Despite being able to spall a thin semiconductor layer from a base semiconductor substrate, there are some concerns with prior art spalling methods. For example, the controlled spalling of the prior art is best initiated from a stressor layer that has an abrupt and sharply defined edge profile (versus a tapered edge profile in which the stressor layer thickness gradually decreases to zero over a macroscopic distance).

For best results, the edge of the stressor layer is formed in proximity to a vertical sidewall of the underlying base substrate. In one approach to the stressor layer formation, the edges of stressor layer are aligned with the outer edges of the base substrate. However, since perfect alignment can be difficult to achieve, some portion of the stressor layer can extend onto the sidewalls of the base substrate, potentially inhibiting spalling. Alternatively, the stressor layer dimensions can be designed so that there is a border between the stressor layer edges and the edge of the substrate. However, defining such a border lithographically can add cost and complexity to the spalling process. It would therefore be beneficial to have a simple, non-lithographic process for forming edges in a stressor layer.

There are also reasons to believe that stress concentrations favorable for controlled spalling might result from changing the local geometry of the base substrate near the edge of the stressor layer. For example, one might pattern a Ni stressor layer on a base substrate to form a Ni mesa region with sharply defined edges and then recess some portion of the exposed base substrate immediately adjacent to the Ni edges to extend the mesa structure into the base substrate. It would therefore be beneficial to have a simple and inexpensive method for forming such structures.

Finally, large-area spalls are prone to cracking during spalling and subsequent handling, while alternative approaches based on tiling multiple small-area spalls present potential difficulties in keeping track of or handling multiple pieces. It would therefore be beneficial to have a method with the advantages of small pieces (i.e., less bending and cracking) but the ease of single, large area pieces.

The above concerns are addressed in the present disclosure by employed laser ablation for defining an edge within a material layer that can be used for spalling. By "laser ablation" it is meant a process in which laser irradiation is used to remove a material layer from a spalling structure. By "spalling structure" it is meant a structure including at least a base substrate and at least one material layer, e.g., stressor layer and/or plating seed layer, formed thereon.

As described above, laser irradiation can be used to ablate, i.e., remove material. In addition to removing material, laser irradiation can also cause a local heating and/or a material redistribution that can be used in some embodiments to change the stress within the spalling structure. For example, laser heating of the stressor layer stack edges adjacent to the ablated trench may produce a grain growth in the stressor layer stack material that results in a change in stress at the stressor layer edge. The stress characteristics of the spalling structure can also be altered by the redistributed trench material that can pile up on the stressor layer stack at the trench edges. Without wishing to be bound by any theory, it appears that liquid melt material in the irradiated region trench region is driven out of the center of the trench area by the pressure of the vapor ablation plume, leaving the expelled liquid to solidify on and above the trench edges. Such laser-induced alterations in stressor layer edge morphology and stress can be exploited to tune the threshold stress required for spall initiation.

In one embodiment, laser ablation is used to form a trench within at least a blanket layer of a stressor layer that is located atop a base substrate. A remaining portion of the laser ablated stressor layer has an edge that can be used for spalling. This embodiment of the present disclosure is illustrated in FIGS. 1, 2, 3A-3E, 4 and 5 of the present disclosure.

Figure 1:
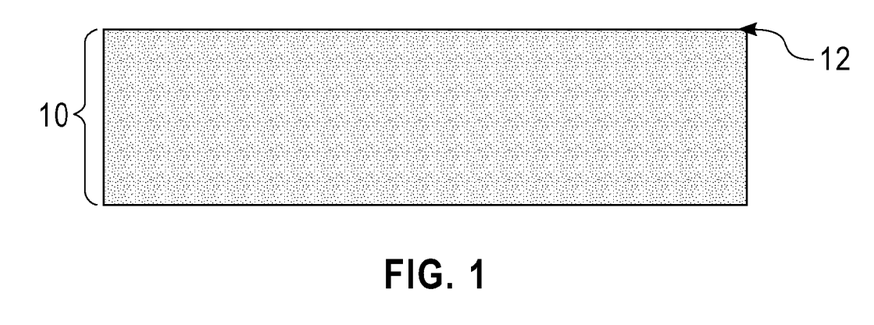
FIG. 1 is a pictorial representation (though a cross-sectional view) illustrating a base substrate that can be employed in one embodiment of the present disclosure.

Referring first to FIG. 1, there is shown a base substrate 10 having an uppermost surface 12 that can be employed in one embodiment of the present disclosure. The base substrate 10 employed in the present disclosure may comprise a semiconductor material, a glass, a ceramic, or any another material whose fracture toughness is less than that of the stressor layer to be subsequently formed.

Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

When the base substrate 10 comprises a semiconductor material, the semiconductor material may include, but is not limited to Si, Ge, SiGe, SiGeC, SiC, Ge alloys, GaSb, GaP, GaAs, InAs, InP, and all other III-V or II-VI compound semiconductors. In some embodiments, the base substrate 10 is a bulk semiconductor material. In other embodiments, the base substrate 10 may comprise a layered semiconductor material such as, for example, a semiconductor-on-insulator or a semiconductor on a polymeric substrate. Illustrated examples of semiconductor-on-insulator substrates that can be employed as base substrate 10 include silicon-on-insulators and silicon-germanium-on-insulators.

When the base substrate 10 comprises a semiconductor material, the semiconductor material can be doped, undoped or contain doped regions and undoped regions.

In one embodiment, the semiconductor material that can be employed as the base substrate 10 can be single crystalline (i.e., a material in which the crystal lattice of the entire sample is continuous and unbroken to the edges of the sample, with no grain boundaries). In another embodiment, the semiconductor material that can be employed as the base substrate 10 can be a polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the base substrate 10 can be amorphous (i.e., a non-crystalline material that lacks the long-range order characteristic of a crystal). Typically, the semiconductor material that can be employed as the base substrate 10 is a single crystalline material.

When the base substrate 10 comprises a glass, the glass can be a $SiO_2$-based glass which may be undoped or doped with an appropriate dopant. Examples of doped $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic is any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, one or more devices including, but not limited to, transistors, capacitors, diodes, BiCMOS, resistors, etc. can be processed on and/or within the uppermost surface 12 of the base substrate 10 utilizing techniques well known to those skilled in the art.

In some embodiments of the present disclosure, the uppermost surface 12 of the base substrate 10 can be cleaned prior to further processing to remove surface oxides and/or other contaminates therefrom. In one embodiment of the present disclosure, the base substrate 10 is cleaned by applying to the base substrate 10 a solvent such as, for example, acetone and isopropanol, which is capable of removing contaminates and/or surface oxides from the uppermost surface 12 of the base substrate 10.

Figure 2:
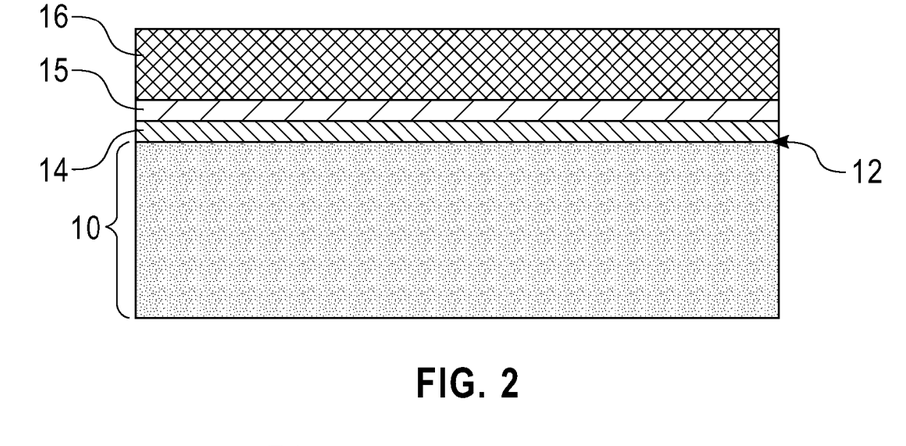
FIG. 2 is a pictorial representation (though a cross sectional view) illustrating the base substrate after forming an optional metal-containing adhesion layer, an optional plating seed layer and a stressor layer thereon.

Referring to FIG. 2, there is depicted the base substrate 10 of FIG. 1 after forming an optional metal-containing adhesion layer 14, an optional plating seed layer 15, and a stressor layer 16 atop the uppermost surface 12 of the base substrate 10. In some embodiments, at least one of the optional metal-containing adhesion layer 14 and the optional plating seed layer 15 is employed. In other embodiments, both the optional metal-containing adhesion layer 14 and the optional plating seed layer 15 are employed.

The optional metal-containing adhesion layer 14 is employed in embodiments in which the stressor layer to be subsequently formed has poor adhesion to uppermost surface 12 of base substrate 10. Typically, the metal-containing adhesion layer 14 is employed when a metal-containing stressor layer is employed.

The optional metal-containing adhesion layer 14 employed in the present disclosure includes any metal adhesion material such as, but not limited to Ti/W, Ti, Cr, Ni or any combination thereof. The optional metal-containing adhesion layer 14 may comprise a single layer or it may include a multilayered structure comprising at least two layers of different metal adhesion materials.

The metal-containing adhesion layer 14 that can be optionally formed on the uppermost surface 12 of base substrate 12 can be formed at room temperature (15° C.-40° C.) or above. In one embodiment, the optional metal-containing adhesion layer 14 can be formed at a temperature which is from 20° C. to 180° C. In another embodiment, the optional metal-containing adhesion layer 14 can be formed at a temperature which is from 20° C. to 60° C.

The metal-containing adhesion layer 14, which may be optionally employed, can be formed utilizing deposition techniques that are well known to those skilled in the art. For example, the optional metal-containing adhesion layer 14 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer 14 typically has a thickness of from 5 nm to 200 nm, with a thickness of from 50 nm to 150 nm being more typical. Other thicknesses for the optional metal-containing adhesion layer 14 that are below and/or above the aforementioned thickness ranges can also be employed in the present disclosure.

The optional plating seed layer 15 is employed in embodiments in which the stressor layer to be subsequently formed is a metal and plating is used to form the metal-containing stressor layer. The optional plating seed layer 15 is employed to selectively promote subsequent plating of a pre-selected metal-containing stressor layer. The optional plating seed layer 15 may comprise, for example, single layer of Ni or a layered structure of two or more metals such as Al (bottom)/Ti/Ni (top).

The thickness of the optional seed layer 15 may vary depending on the material or materials of the optional plating seed layer 15 as well as the technique used in forming the same. Typically, the optional plating seed layer 15 has a thickness from 2 nm to 400 nm. The optional plating seed layer 15 can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

In one embodiment in which the optional metal-containing adhesion layer 14 is employed, the stressor layer 16 can be formed directly on an upper surface of the optional metal-containing adhesion layer 14. In some embodiments, the stressor layer 16 can be formed directly on an upper surface of the optional plating seed layer 15. In some embodiments in which the optional metal-containing adhesion layer 14 and the optional plating seed layer 15 are not present, the stressor layer 16 is formed directly on the upper surface 12 of base substrate 10; this particular embodiment is not shown in the drawings, but can readily be deduced from the drawings illustrated in the present application.

The stressor layer 16 employed in the present disclosure includes any material that is under tensile stress on base substrate 10 at the spalling temperature. As such, the stressor layer 16 can also be referred to herein as a stress-inducing layer. In accordance with the present disclosure, the stressor layer 16 has a critical thickness and stress value that cause spalling mode fracture to occur within the base substrate 10. By "spalling mode fracture" it is meant that a crack is formed within base substrate 10 and the combination of loading forces maintain a crack trajectory at a depth below the stressor/substrate interface. By critical condition, it is meant that for a given stressor material and base substrate material combination, a thickness value and a stressor value for the stressor layer is chosen that render spalling mode fracture possible (can produce a $K_I$ value greater than the $K_{IC}$ of the substrate).

In the drawings, the dotted line that is designated as element 18 represent the fracture plane or spalling depth. The fracture plane 18 is nominally parallel to upper surface 12 of base substrate 10. The terms "spalling depth" and "fracture plane" are used interchangeably and defined as the vertical spacing between doted line 18 and the upper surface 12 of base substrate 10.

The thickness of the stressor layer 16 is chosen to provide the desired fracture depth within the base substrate 10. For example, if the stressor layer 16 is chosen to be Ni, then fracture will occur at a depth below the stressor layer 16 roughly 2 to 3 times the Ni thickness. The stress value for the stressor layer 16 is then chosen to satisfy the critical condition for spalling mode fracture. This can be estimated by inverting the empirical equation given by $t^* = [(2.5 \times 10^6)(K_{IC}^{3/2})]/\sigma^2$, where $t^*$ is the critical stressor layer thickness (in microns), $K_{IC}$ is the fracture toughness (in units of $MPa \cdot m^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression.

Illustrative examples of materials that are under tensile stress when applied atop the base substrate 10 and thus can be used as the stressor layer 16 include, but are not limited to, a metal, a polymer, such as a spall inducing tape layer, or any combination thereof. The stressor layer 16 may comprise a single stressor layer, or a multilayered stressor structure including at least two layers of different stressor material can be employed.

In one embodiment, the stressor layer 16 is a metal. In another embodiment, the stressor layer 16 is a spall inducing tape. In another embodiment, for example, the stressor layer 16 may comprise a two-part stressor layer including a lower part and an upper part. The upper part of the two-part stressor layer can be comprised of a spall inducing tape layer.

When a metal is employed as the stressor layer 16, the metal can include, for example, Ni, Cr, Fe, or W. Alloys of these metals can also be employed. In one embodiment, the stressor layer 16 includes at least one layer consisting of Ni.

When a polymer is employed as the stressor layer 16, the polymer is a large macromolecule composed of repeating structural units. These subunits are typically connected by covalent chemical bonds. Illustrative examples of polymers that can be employed as the stressor layer 16 include, but are not limited to, polyimides polyesters, polyolefins, polyacrylates, polyurethane, polyvinyl acetate, and polyvinyl chloride.

When a spall inducing tape layer is employed as the stressor layer 16, the spall inducing tape layer includes any pressure sensitive tape that is flexible, soft, and stress free at a first temperature used to form the tape, yet strong, ductile and tensile at a second temperature used during removal of the upper portion of the base substrate 10. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 10 (with a lower thermal coefficient of expansion) and the tape (with a higher thermal expansion coefficient).

Typically, the pressure sensitive tape that is employed in the present disclosure as stressor layer 16 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 16 employed in the present disclosure can be formed at a first temperature which is at room temperature (15° C.-40° C.). In another embodiment, when a tape layer is employed, the tape layer can be formed at a first temperature which is from 15° C. to 60° C.

When the stressor layer 16 is a metal or polymer, the stressor layer 16 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 16 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present disclosure as stressor layer 16 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on a surface of the base substrate 10, wherein a lower part of the two-part stressor layer is formed at a first temperature which is at room temperature or slight above (e.g., from 15° C. to 60° C.), wherein an upper part of the two-part stressor layer comprises a spall inducing tape layer at an auxiliary temperature which is at room temperature.

If the stressor layer 16 is of a metallic nature, it typically has a thickness of from 3 μm to 50 μm, with a thickness of from 4 μm to 7 μm being more typical. Other thicknesses for the stressor layer 16 that are below and/or above the aforementioned thickness ranges can also be employed in the present disclosure.

If the stressor layer 16 is of a polymeric nature, it typically has a thickness of from 10 μm to 200 μm, with a thickness of from 50 μm to 100 μm being more typical. Other thicknesses for the stressor layer 16 that are below and/or above the aforementioned thickness ranges can also be employed in the present disclosure.

Referring now to FIGS. 3A-3E, there are illustrated the structure of FIG. 2 after forming a trench 20 within the spalling structure (i.e., the base substrate 10, the optional metal-containing adhesion layer 14, the optional plating seed layer 15 and the stressor layer 16) using laser ablation. In some embodiments, the trench 20 is formed partially within the stressor layer 16 (not shown). In another embodiment, the trench 20 is formed completely through the stressor layer 16, but stops within or is formed completely through the optional plating seed layer 15. In a further embodiment, the trench 20 is formed completely through the stressor layer 16, but stops within or is formed completely through the optional metal-containing adhesion layer 14. Other embodiments, some of which are illustrated in FIGS. 3A-3E, are also possible.

Figure 3A:
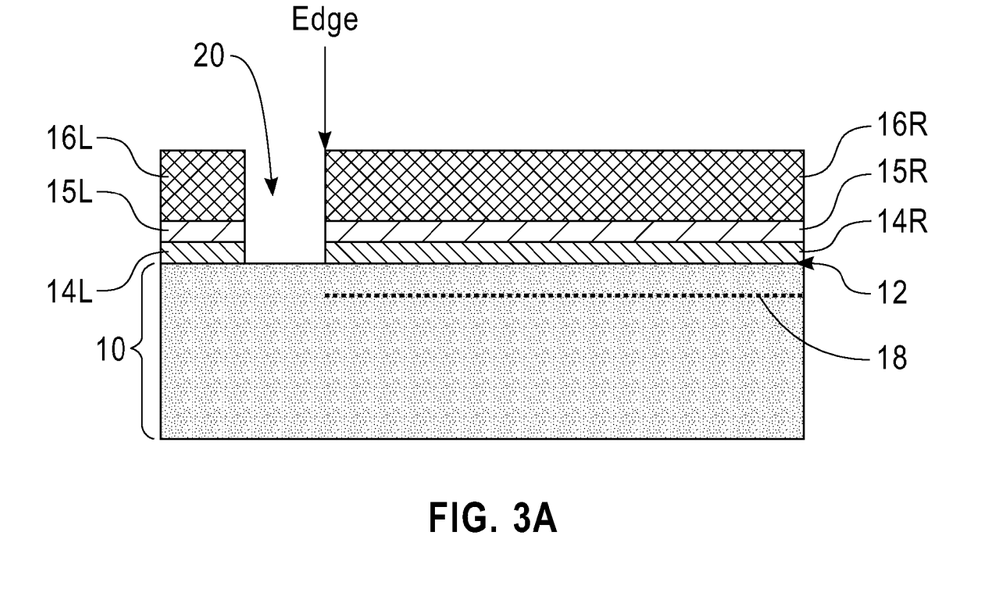
Figure 3B:
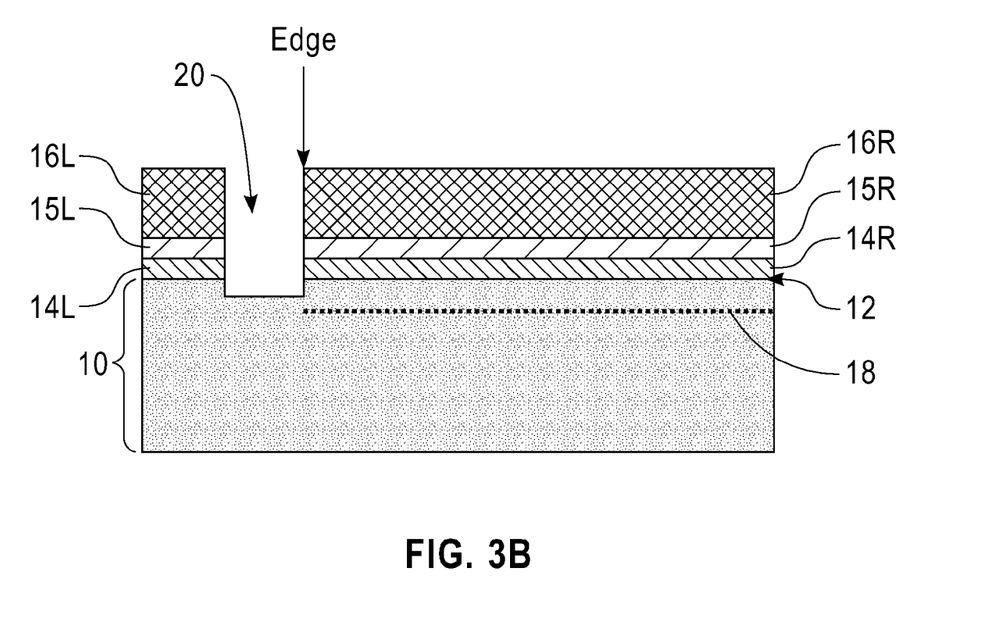
Figure 3C:
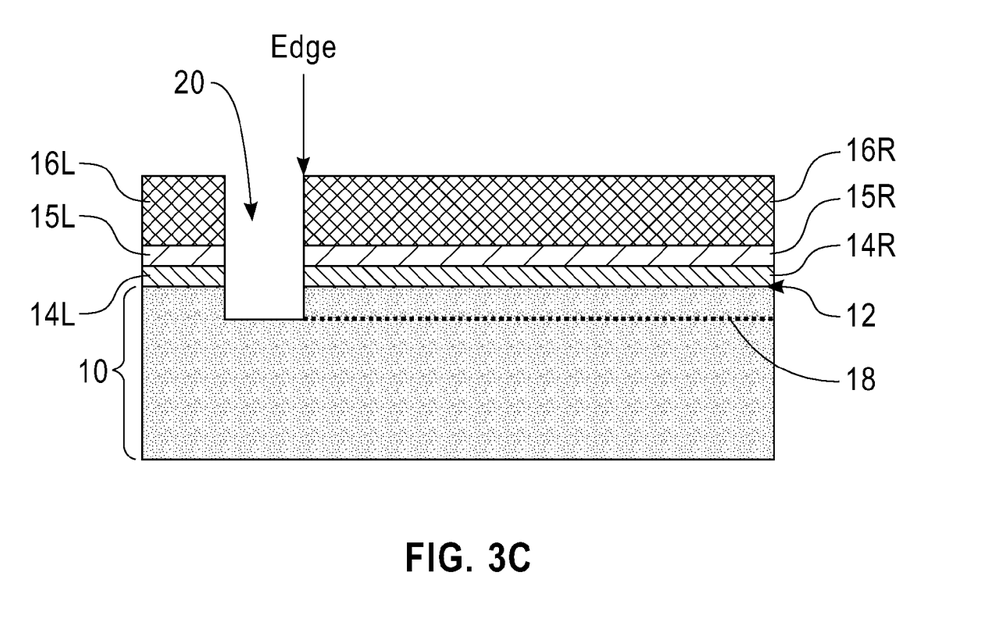

In the embodiment depicted in FIG. 3A, the trench 20 stops on an uppermost surface of the base substrate 12. In the embodiment depicted in FIG. 3B, the trench 20 extends in the base substrate 10 to a depth that is less than the fracture plane 18. In the embodiment depicted in FIG. 3C, the trench 20 extends in the base substrate 10 to a depth that is equal to the fracture plane 18. In the embodiment depicted in FIG. 3D, the trench 20 extends in the base substrate 10 to a depth that is greater than the fracture plane 18. In the embodiment depicted in FIG. 3E, the trench 20 extends in the base substrate 10 and has an expanded width opening 24. In FIGS. 3A-3E, the designation "L" refers to a portion of a specific material that will not be involved in subsequent spalling due to its being outside a boundary of a region to be spalled. The designation "R" refers to a portion of a specific material layer that will be involved in spalling due to its being inside a boundary of a region to be spalled. The stressor layer 16R can be referred to as a stress concentration region of the spalling structure.

As shown, the trench 20 that is formed by laser ablation has a surface within the trench on which spalling can be initiated. As such, fracture of the base substrate 10 begins on a trench surface and continues until reaching a condition of controlled propagation along fracture plane 18.

Notwithstanding the depth of the trench 20, the trench is formed by laser ablation. In some embodiments and as shown in FIG. 3E, a trench formed by laser ablation may be expanded by other etch processes to form the trench 20 with the expanded width opening 24. Expanded width opening 24 would typically have interior corners 25 functioning as stress concentration regions.

Figure 3D:
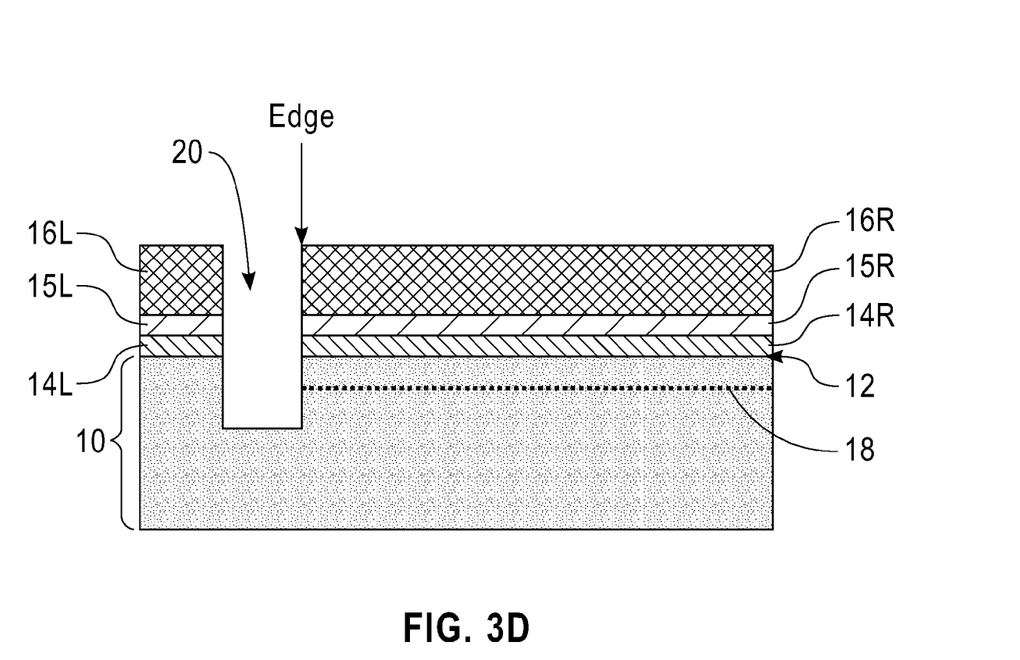
Figure 3E:
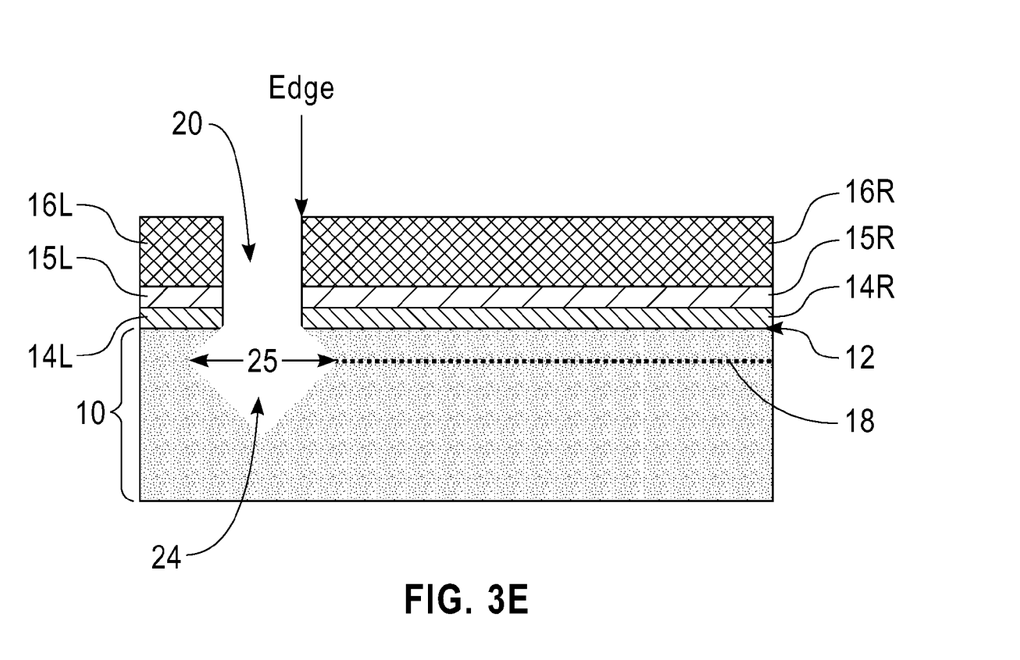

For the case of certain base substrates 10 (e.g., monocrystalline Si with an appropriate orientation), the structure of FIG. 3E may be formed from the structure of FIG. 3D, using an anisotropic wet etch employing a hydroxide solution including at least one of KOH, NaOH, CeOH, RbOH, $NH_4OH$, or tetramethylammonium hydroxide (TMAH), or a wet etch employing ethylene diamine pyrocatechol (EDP).

The laser ablation process (which can also be referred to herein as laser scribing) preferably includes a pulsed irradiation process. While continuous wave (CW) lasers may, in certain circumstances, also be used to define trench edges in a stressor layer stack, pulsed irradiation is generally preferable because material removal can be accomplished with significantly less heating outside the immediate area being irradiated. Optimal conditions will depend on the absorption characteristics and physical properties of the material layers being ablated. In some embodiments in which both a polymeric stress inducing tape and a metal-containing stressor layer are employed, an ultraviolet (UV) wavelength laser (e.g., one with a wavelength in the range 193 nm to 355 nm) can be used to ablate the stress inducing tape while a UV or longer wavelength laser (e.g., one with a wavelength in the range 193 nm to 1064 nm) can be used to ablate the metal-containing stressor layer. Generally, the laser ablation can be performed at any wavelength at which the material to be ablated has (i) a high absorption coefficient α (or short absorption length $1/\alpha$), where $1/\alpha$ is defined as the thickness of material that will result in a 1/e attenuation in transmitted light intensity, and (ii) a reflectivity that is compatible with at least some light absorption. For example, Ni can be ablated well at both 532 nm and 1064 nm. At a wavelength of 532 nm, Ni has a room temperature $1/\alpha$ value of about 10-13 nm and a reflectivity of about 60-65%, whereas at a wavelength of 1064 nm Ni has a room temperature $1/\alpha$ value of about 18 nm and a reflectivity of about 66-74%. Many semiconductors have absorption coefficients that strongly increase with temperature, thus allowing ablation to occur even in materials that are only weakly absorbing at room temperature.

A variety of pulsed lasers may be used to effect ablation, including, but not limited to, diode-pumped solid state (DPSS) lasers and excimer lasers, with pulse widths (or durations) ranging from the femtosecond range to the microsecond range. In one embodiment a diode-pumped Q-switched laser with an output at 1064 nm or 532 nm (e.g., a Coherent MATRIX-1064 or MATRIX-532) is used in an OpTek laser scribing system which has a stationary laser and a moving sample stage. In other embodiments, the laser beam can be moved while the sample is held stationary. The laser ablation can be performed in a single pass, or multiple passes can be used. When multiple passes are employed, from 2 to 30 passes are typically, but not necessarily always, employed. Qualitatively, the number of passes required to ablate a trench in a given material to a given depth is proportional to the scan speed (e.g., two passes at a scan speed of 100 mm/sec produce approximately the same effect as one pass at 50 mm/sec). The number of passes to ablate a given trench would typically be proportional to the desired trench depth (more passes for deeper trenches) and inversely proportional to the amount of material ablated with each laser pulse.

In one embodiment, the laser ablation is performed at a scan rate of about 50 mm/sec-100 mm/sec with radiation focused to a spot size of 30 μm-60 μm diameter using repetition rates from 30 kHz to 100 kHz, pulse widths ranging from 20 ns to 40 ns, and an average power from 8 W to 15 W. For a repetition rate of 50 kHz, pulse width of 30 ns, and average power of 15 W, these conditions correspond to a pulse energy of 300 μJ, a fluence per pulse of 11 $J/cm^2$-42 $J/cm^2$, and a peak power of $3.5 \times 10^8$ $W/cm^2$ to $1.4 \times 10^9$ $W/cm^2$. Other repetition rates, pulse widths, and pulse energies can also be employed in forming the laser ablated trenches. As a general rule, the fluence per pulse required for ablation decreases as pulse width decreases.

Depending on the laser pulse width, metals can be ablated at one of a fluence per pulse from 0.1 $J/cm^2$ to 200 $J/cm^2$ and a power density from $1 \times 10^8$ $W/cm^2$ to $1 \times 10^{14}$ $W/cm^2$.

Specifically, spontaneous spalling has been observed in base substrates of Si with adhesion/plating seed layers of Ti(50 nm)/Ni(400 nm) and plated Ni stressor layers of thickness 20 μm-30 μm after 3-4 passes with laser conditions of wavelength 1064 nm, repetition rate 60 kHz, average power 15 W, and pulse width about 30 ns and scan conditions of 100 mm/sec to form a trench about 40 μm wide. These conditions correspond to a pulse energy of 250 μJ, a fluence per pulse of about 20 $J/cm^2$ and a peak power density of $6.6 \times 10^8$ $W/cm^2$. While in certain cases spontaneous spalling is desired, it is typically more preferably to form the laser ablated trenches without spalling and to complete spalling with the use of an optional handle substrate.

The characteristics of the trench 20 formed, such as trench depth and amount of material build-up at the trench edges, can be varied by adjusting the laser focus and the duration of laser exposure. Sample scans speeds can range from 50 mm/s to 100 mm/s.

Figure 14A:
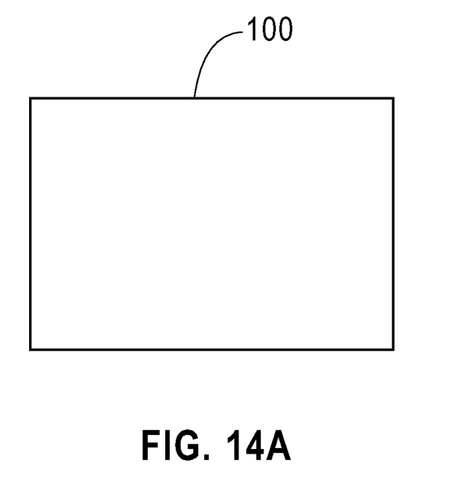
FIG. 14A-14D are pictorial representations (through top-down views) depicting representative examples of the different laser scribe patterns that can be used in the present disclosure.
Figure 14B:
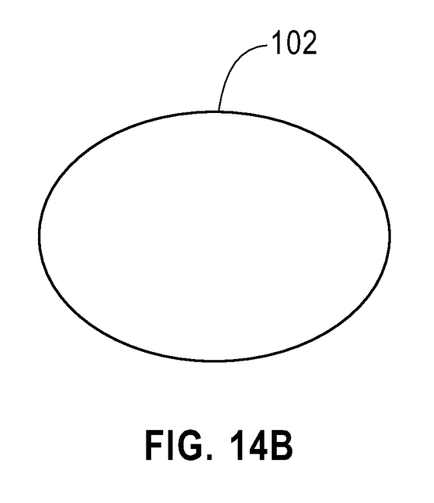
Figure 14C:
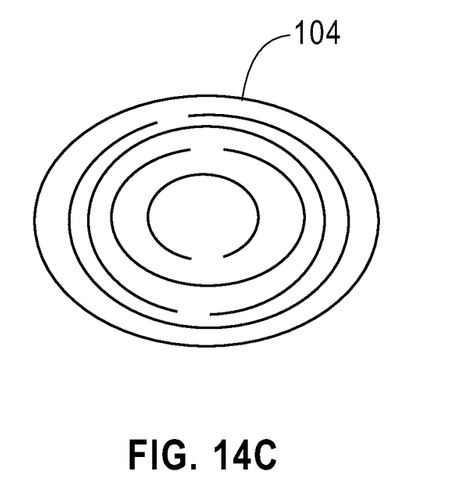
Figure 14D:
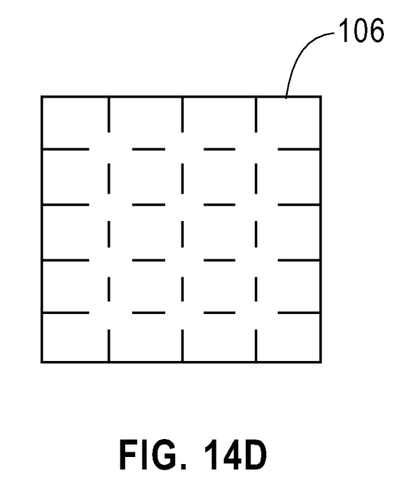

Trenches 20 can formed in any pattern or arrangement desired by the user, including polygons and circles. FIGS. 14A-14D show top views of some exemplary shapes of the trenches 20 that can be formed laser ablation. Specifically, FIG. 14A shows that the trenches can be in the shape of a square 100 and FIG. 14B shows that the trench can be in the shape of a circle 102. Such shapes are useful when one wants to make clean stressor layer edges just inside the periphery of base substrates comprising square or round ingots. FIG. 14C shows that the trench can be in the shape of flexible interconnect nested rings 104, and FIG. 14D shows that the trench can be in the shape of linked squares 106. Such shapes might be useful for which especially thick stressor layers and/or spalled films make additional flexibility desirable.

Figure 4:
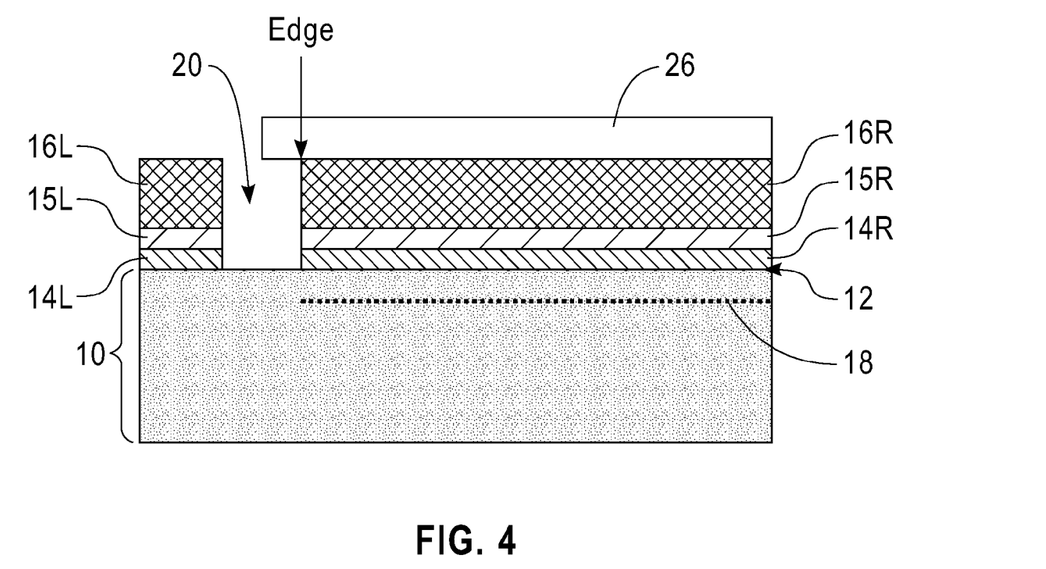
FIG. 4 is a pictorial representation (though a cross sectional view) illustrating the structure of FIG. 3A after forming an optional handle substrate atop the stressor layer.

Referring to FIG. 4, there is depicted the structure of FIG. 3A after forming an optional handle substrate 26 atop stressor layer portion 16R. It is noted that although FIG. 3A is illustrated as including the optional handle substrate 26, an optional handle substrate 26 can be formed atop any of the structures depicted in FIGS. 3B, 3C, 3D and 3E.

The optional handle substrate 26 employed in the present disclosure comprises any flexible material which has a minimum radius of curvature of less than 30 cm. Illustrative examples of flexible materials that can be employed as the optional handle substrate 26 include a metal foil or a polyimide foil. The optional handle substrate 26 can be used to provide better fracture control and more versatility in handling the spalled portion, i.e., the portion of the base substrate below stressor layer portion 16R and above the fracture plane 18, of the base substrate 10. Moreover, the optional handle substrate 26 can be used to guide the crack propagation during spalling. The optional handle substrate 26 of the present disclosure is typically, but not necessarily, formed at a first temperature which is at room temperature (15° C.-40° C.).

The optional handle substrate 26 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. The optional handle substrate 26 typical has a thickness of from 1 µm to few mm, with a thickness of from 70 µm to 120 µm being more typical. Other thicknesses for the optional handle substrate 26 that are below and/or above the aforementioned thickness ranges can also be employed in the present disclosure.

Figure 5:
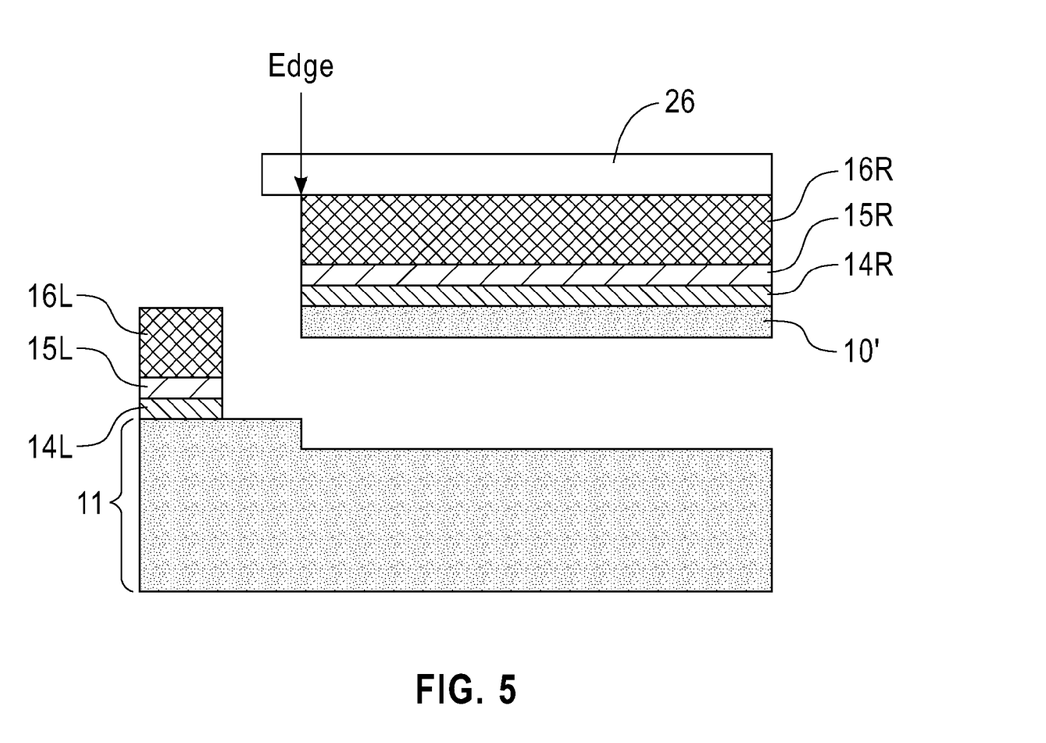
FIG. 5 is a pictorial representation (through a cross sectional view) illustrating the structure of FIG. 4 after removing a material layer region of the base substrate by spalling.

Referring now to FIG. 5, there is depicted the structure of FIG. 4 after removing a material layer region 10' of the base substrate 10 by spalling. Spalling can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly warm up to room temperature by allowing the same to stand at room temperature. Alternatively, the spalled structure can be heated up to room temperature utilizing any heating means.

After spalling, the optional handle substrate 26, stressor layer portion 16R, and, if present the optional plating seed layer portion 15R and the optional metal-containing adhesion layer portion 14R can be removed from the material layer region 10' of the base substrate 10. The unspalled base substrate is labeled as 11. The stressor layer portions 16L and, if present the optional plating seed layer portion 15L and the optional metal-containing adhesion layer portion 14L can be removed from the unspalled portion of the base substrate 11.

The optional handle substrate 26 and the stressor layer portion 16R and the optional plating seed layer portion 15R and the optional metal-containing adhesion layer portion 14R can be removed from the material layer region 10' of the base substrate utilizing conventional techniques well known to those skilled in the art. Portions 16L, 15L and 14L can be removed from the unspalled portion of the base substrate 11 utilizing similar well known processes. For example, and in one embodiment, aqua regia ($HNO_3$/HCl) can be used for removing the optional handle substrate 26, the stressor layer portions 16R and 16L, the optional plating seed layer portions 15R and 15L and the optional metal-containing adhesion layer 14R and 14L. In another example, UV or heat treatment is used to remove the optional handle substrate 26, followed by a chemical etch to remove the stressor layer portions 16R and 16L, followed by a different chemical etch to remove the optional plating seed layer portions 15R and 15L and optional metal-containing adhesion layer portions 14R and 14L.

The thickness of the material layer region 10' of the base substrate 10 varies depending on the material of the stressor layer 16 and the material of the base substrate 10 itself. In one embodiment, the material layer region 10' of the base substrate 10 has a thickness of less than 100 microns. In another embodiment, the material layer region 10' of the base substrate 10 has a thickness of less than 50 microns.

Reference is now made to FIGS. 6, 7, 8A-8B, 9 and 10 which illustrate another embodiment of the present disclosure. In this embodiment, laser ablation is used to form a trench within a blanket material stack including at least an uppermost plating seed layer. A stressor layer is formed on the laser ablated material stack and one portion of the stressor layer has a stress inducing edge that can be used for spalling.

This embodiment of the present disclosure begins by first providing a base substrate 10 such as shown in FIG. 1. After providing the base substrate 10, a material stack 52 including at least an upper plating seed layer is formed on the uppermost surface 12 of the base substrate 10. In some embodiments, material stack 52 also includes a metal-containing adhesion layer beneath the plating seed layer. The description of the metal-containing adhesion layer and plating seed layer employed in this embodiment is the same as that described above for the optional metal-containing adhesion layer 14 and the optional plating seed layer 15. As such, the above materials, thicknesses and processes of forming the optional metal-containing adhesion layer 14 and the optional plating seed layer 15 can be used herein to describe such layers that can be present in the material stack 52. The structure including the material stack 52 on the uppermost surface 12 of the base substrate 10 is shown, for example, in FIG. 6.

Figure 6:
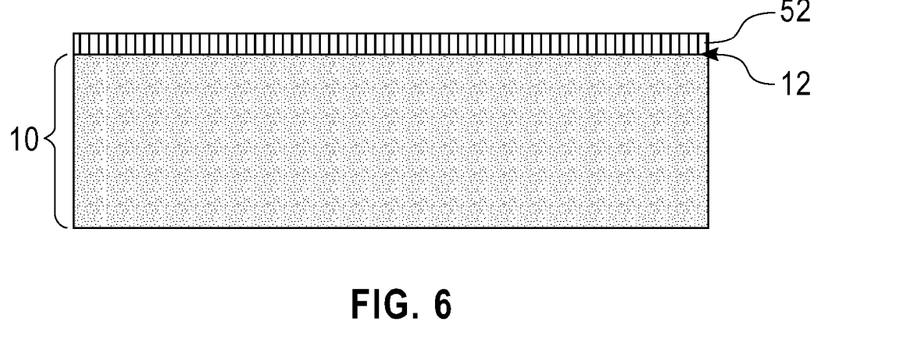
FIG. 6 is a pictorial representation (through a cross sectional view) illustrating the base substrate of FIG. 1 after forming a material stack comprising at least a plating seed layer.
Figure 7:
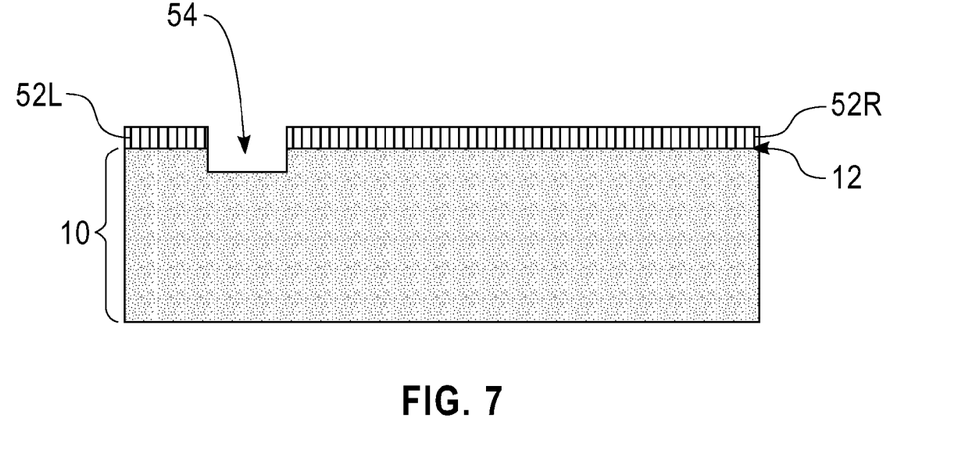
FIG. 7 is a pictorial representation (through a cross sectional view) illustrating the structure of FIG. 6 after forming a trench through the material stack and within a portion of the base substrate.

Referring now to FIG. 7, there is illustrated the structure of FIG. 6 after forming a trench 54 through at least some of material stack 52 and (as shown) optionally into a portion of the base substrate 10. If trench 54 formed in this embodiment extends into the base substrate, it can have a depth that is greater than the fracture plane, equal to the fracture plane, or less than the fracture plane. The fracture plane is not yet defined in FIG. 7. The trench 54 is formed by laser ablation. The laser ablation process, conditions, and shapes used in forming trench 20 in the previous embodiment can be used here for forming trench 54. In FIG. 7, reference 52L denotes a portion of the material stack that will not be involved in spalling, while reference numeral 52R denotes a portion of the material stack that will be involved in subsequent spalling.

Figure 8A:
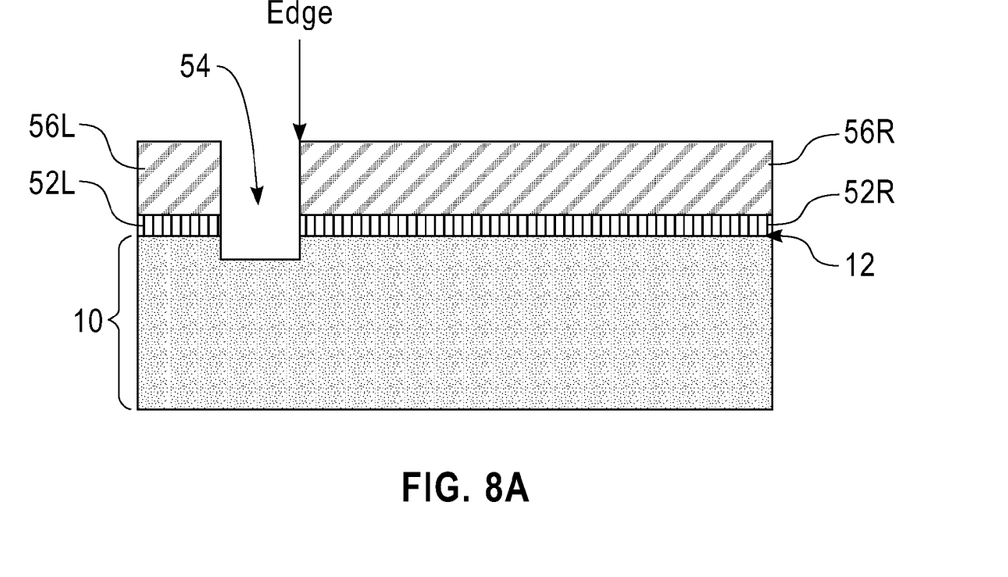
Figure 8B:
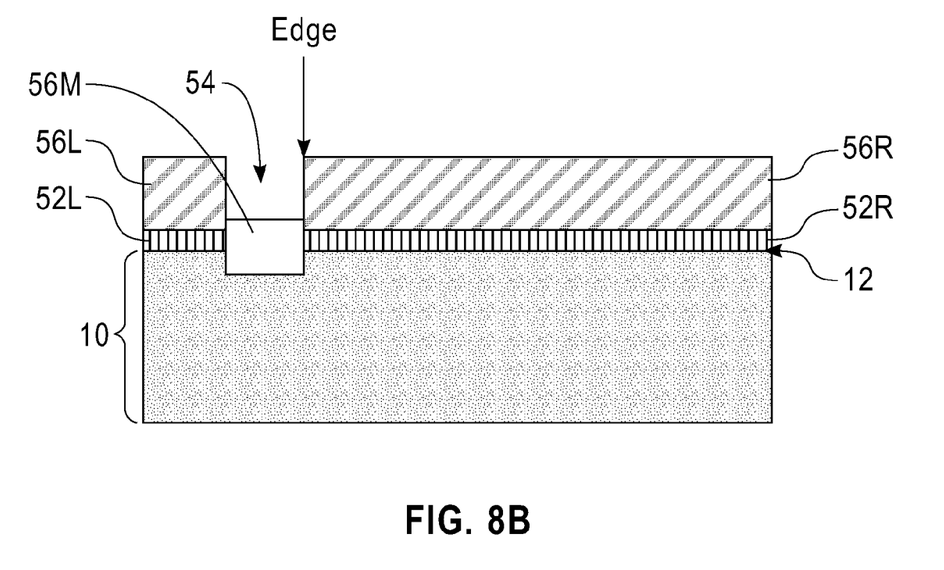

Referring now to FIGS. 8A-8B, there are illustrated the structure of FIG. 7 after forming a stressor layer portion (56R, 56L, 56M). In FIG. 8A, the stressor layer portions 56L (portion not involved in spalling) and 52R (portion involved in spalling) are formed by selective plating, while in FIG. 8B the stressor layer portions (56R, 56L, and 56M) are formed by non-selective plating. The term "selective plating" as used here denotes that the stressor layer portions 56L and 56R are formed only on the upper surfaces of material stack portions 52L and 52R, respectively. The term "non-selective plating" as used here thus denotes that the stressor layer portions 56R, 56L, and 56M are formed on all exposed horizontal surfaces of the structure shown in FIG. 7. In the non-selective embodiment in which stressor layer portion 56M is formed within the trench 54, stressor layer portion 56M acts as a crack stop layer in the structure This functionality may have specialized uses in certain applications, but it is not expected to be desirable for spalling.

In the selective embodiment, the stressor layer portion 56M is absent and stressor layer portion 56R provides the stressor layer edge, as shown in FIGS. 8A-8B. Selective plating processes are well known in the art. As described by Y. S. Liu in U.S. Pat. No. 4,988,412, metals such as Ni may be selectively plated on conductive seed layers comprising a bottom layer of a material that Ni will not plate on (e.g., Al, or even the bare substrate itself) and a top layer of a material that Ni will plate on (e.g., Au or Ni). Regions of the top seed layer material are removed to expose regions of the bottom seed layer material where plating is not desired. In principle, it should be possible to get Ni to plate on a noble or near-noble metal seed layer selectively to exposed regions of a semiconductor base substrate (e.g., p-type Si). However, in practice, it can be difficult to cleanly ablate regions of seed material 52 without leaving residual metal-semiconductor compounds (e.g., silicides) on which Ni will readily plate.

The stressor layer portions (56R and 56M) of this embodiment of the present disclosure comprise one of the metal-containing stressor materials mentioned above for stressor layer 16.

Figure 9:
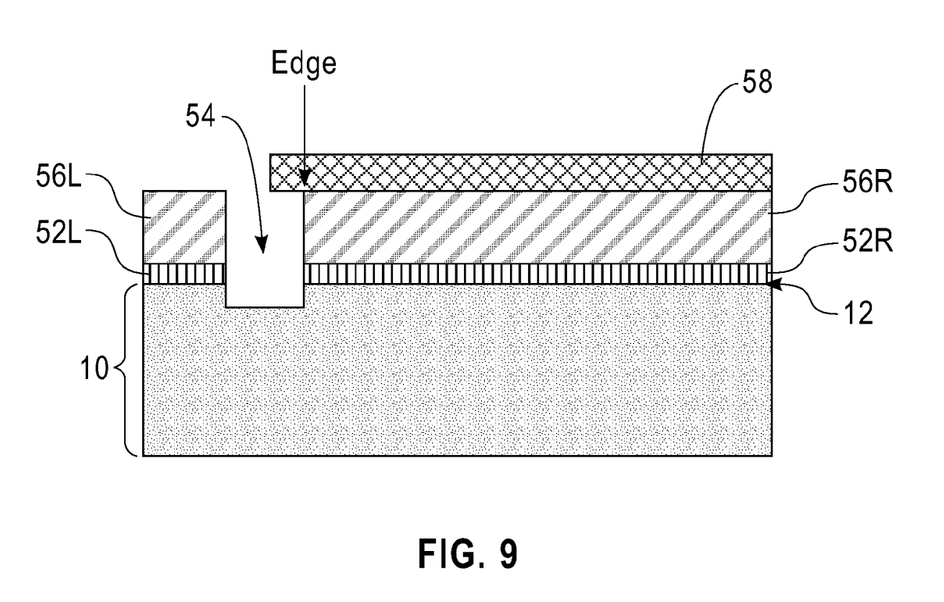
FIG. 9 is a pictorial representation (though a cross sectional view) illustrating the structure of FIG. 8A after forming an optional handle substrate atop the stressor layer.

Referring now to FIG. 9, there is illustrated the structure of FIG. 8A after forming an optional handle substrate 58 atop the stressor layer portion 56R. Although illustration is made to forming the optional handle substrate 58 to the structure shown in FIG. 8A, the optional handle substrate 58 can also be formed on the structure shown in FIG. 8B. The material, thickness and process of forming the optional handle substrate 58 are the same as that mentioned above in the first embodiment for the optional handle substrate 26.

Figure 10:
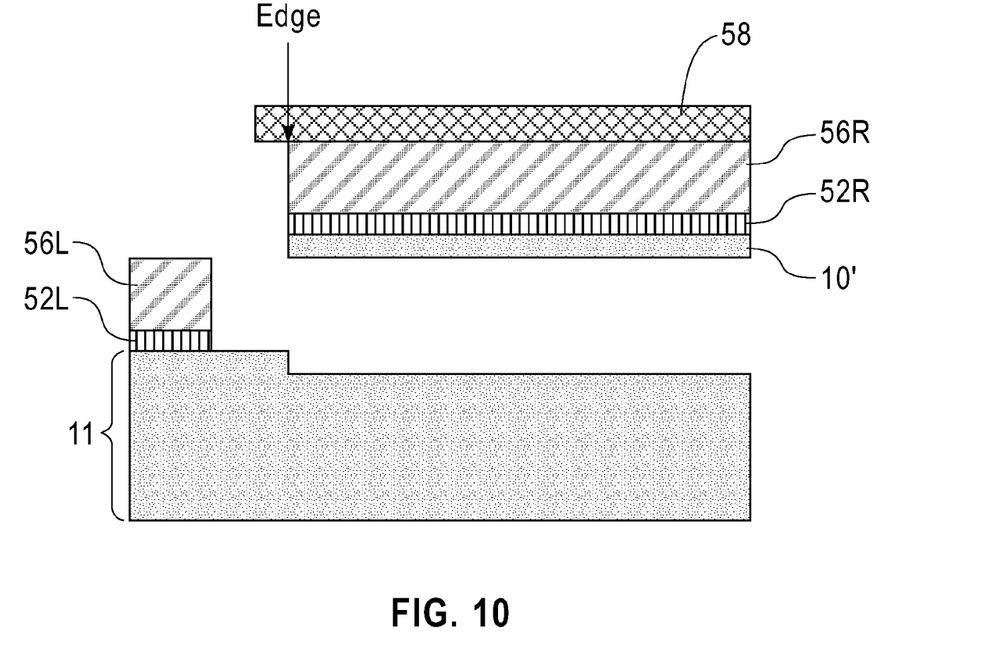
FIG. 10 is a pictorial representation (through a cross sectional view) illustrating the structure of FIG. 9 after removing a material layer region of the base substrate by spalling.

Referring now to FIG. 10, there is illustrated the structure of FIG. 9 after removing an upper portion 10 of the base substrate 10 by spalling. The spalling used in this embodiment is the same as the spalling described above for the first embodiment.

Figure 11:
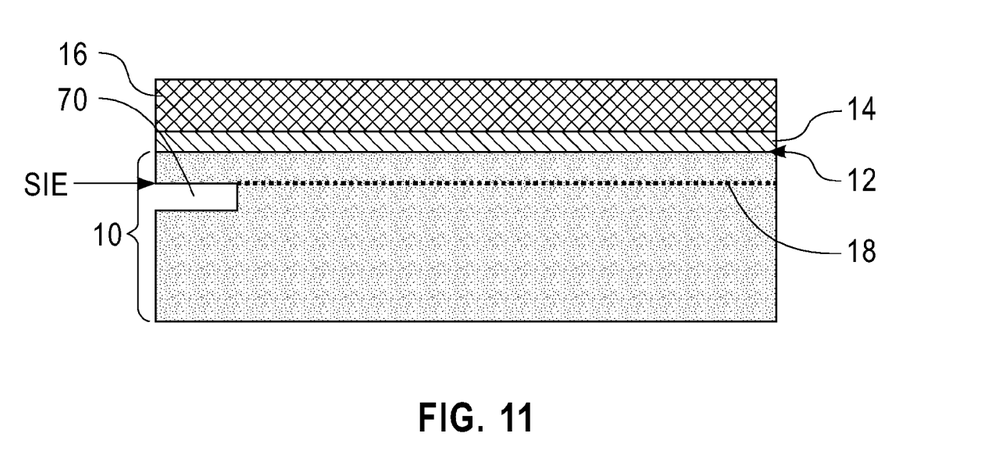
FIG. 11 is a pictorial representation (through a cross sectional view) illustrating the structure of FIG. 2 after forming a laser-generated trench in a vertical sidewall of the base substrate.
Figure 12:
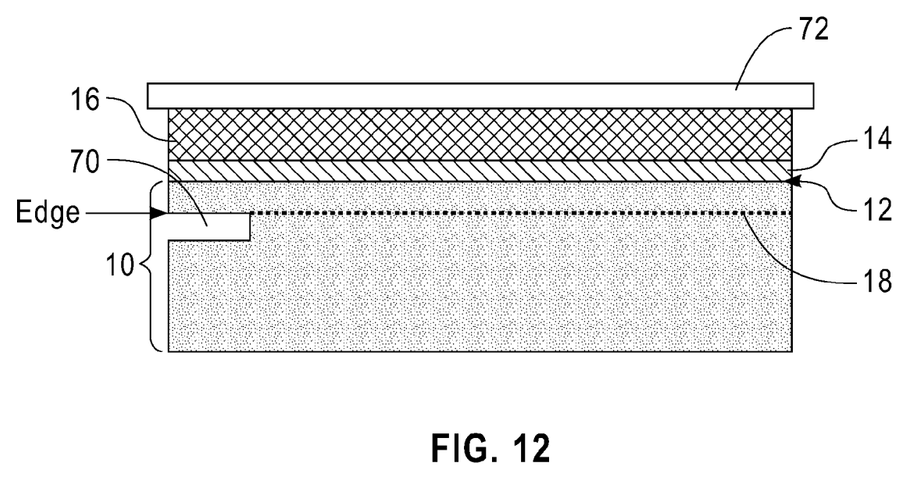
FIG. 12 is a pictorial representation (though a cross sectional view) illustrating the structure of FIG. 11 after forming an optional handle substrate atop the stressor layer.
Figure 13:
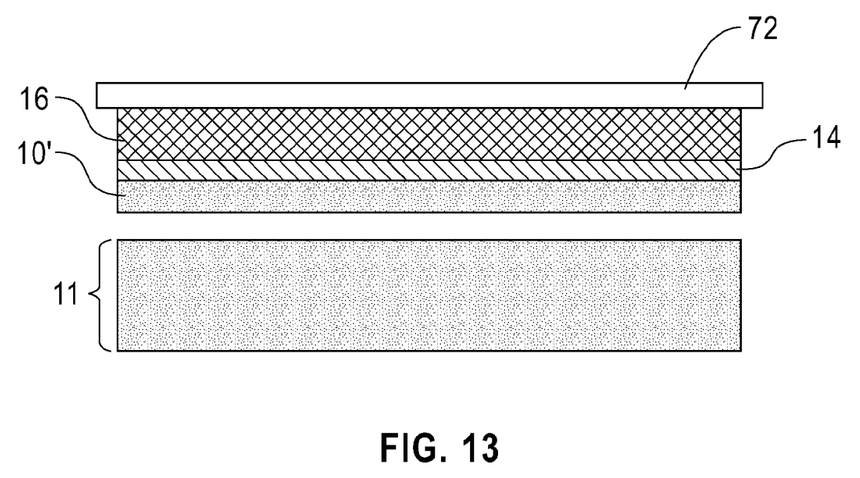
FIG. 13 is a pictorial representation (through a cross sectional view) illustrating the structure of FIG. 12 after removing a material layer region of the base substrate by spalling.

Reference now is made to FIGS. 11-13 which illustrate a third embodiment of the present disclosure. In this embodiment, laser ablation is used to form a trench within an edge of the base substrate itself. The laser-defined trench has an edge that can be used for spalling.

This embodiment of the present disclosure begins by first providing the structure that is illustrated in FIG. 2 of the first embodiment of the present disclosure. Although not illustrated, an optional plating seed layer can be formed between the optional metal-containing adhesion layer 14 and the stressor layer 16, or between the base substrate 10 and the stressor layer 16. In some embodiments, no optional metal-containing adhesion layer 14 and optional plating seed layer are employed. For illustrative purposes only, the plating seed layer 15 of FIG. 2 will not be shown in FIGS. 11-13.

Referring to FIG. 11, there is illustrated the spalling structure after forming a laser-ablated trench 70 in a vertical sidewall of the base substrate 10. The laser ablation process, conditions, and shapes used in forming trench 20 in the previous embodiment can be used here for forming laser-ablated trench 70. In this embodiment, the depth of trench 70 can vary and also laser ablation can be used in conjunction with an etching process, for example an anisotropic etching process, to provide a trench in the base substrate 10 that has an expanded width opening therein.

Referring to FIG. 12, there is depicted the structure of FIG. 11 after forming an optional handle substrate 72 atop the stressor layer 16. The material, thickness and process of forming the optional handle substrate 72 is the same as that mentioned above in the first embodiment for the optional handle substrate 26.

Referring to FIG. 13, there is illustrated the structure of FIG. 12 after removing a material layer region 10' of the base substrate 10 by spalling. Spalling used in this embodiment is the same as that mentioned above for the first embodiment of the present disclosure.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of removing a material layer region of a base substrate, said method comprising:
    forming at least a stressor layer atop an uppermost surface of a base substrate;
    forming a trench by laser ablation at least within the stressor layer to define an edge of a material layer region to be spalled; and
    spalling the material layer region of the base substrate.

2. The method of claim 1, further comprising at least one of a metal-containing adhesion layer and a plating seed layer located beneath said stressor layer.

3. The method of claim 1, wherein said trench stops on said uppermost surface of the base substrate.

4. The method of claim 1, wherein said trench stops within the base substrate.

5. The method of claim 1, wherein said trench formed by laser ablation is expanded by other etch processes to form an expanded width opening.

6. The method of claim 1, wherein said stressor layer is a metal, a polymer or any combination thereof.

7. The method of claim 6, wherein said stressor layer includes at least said polymer, and said polymer is a spall inducing tape layer.

8. The method of claim 1, wherein said laser ablation comprises pulsed irradiation performed at one of a fluence per pulse from 0.1 to 200 $J/cm^2$ and a power density from $1 \times 10^8$ to $1 \times 10^{14}$ $W/cm^2$.

9. The method of claim 1, wherein said trench has a shape of a polygon, circle, flexible interconnect nested rings or linked squares.

10. The method of claim 1, wherein said spalling is performed at room temperature or a temperature less than room temperature.

11. The method of claim 1, further comprising forming a handle substrate atop said stressor layer portion prior to spalling.

\* \* \* \* \*

UNITED STATES PATENT AND TRADEMARK OFFICE
CERTIFICATE OF CORRECTION

| | | |
|---|---|---|
| PATENT NO. | : 9,079,269 B2 | Page 1 of 1 |
| APPLICATION NO. | : 13/302427 | |
| DATED | : July 14, 2015 | |
| INVENTOR(S) | : Stephen W. Bedell et al. | |

It is certified that error appears in the above-identified patent and that said Letters Patent is hereby corrected as shown below:

Title Page, Item (73) Assignee

It Should Read:

(73) Assignee: International Business Machines Corporation, Armonk, NY (US)
KING ABDULAZIZ CITY FOR SCIENCE AND TECHNOLOGY, RIYADH, Saudia Arabia Signed and Sealed this
Twenty-ninth Day of December, 2015

Michelle K. Lee
*Director of the United States Patent and Trademark Office*